United States Patent
Tanaka

(10) Patent No.: US 9,286,957 B2
(45) Date of Patent: Mar. 15, 2016

(54) SEMICONDUCTOR MEMORY DEVICE AND ERASURE VERIFICATION METHOD FOR SEMICONDUCTOR MEMORY DEVICE

(71) Applicant: FUJITSU SEMICONDUCTOR LIMITED, Yokohama, Kanagawa (JP)

(72) Inventor: Kengo Tanaka, Tachikawa (JP)

(73) Assignee: SOCIONEXT INC., Yokohama (JP)

( * ) Notice: Subject to any disclaimer, the term of this patent is extended or adjusted under 35 U.S.C. 154(b) by 239 days.

(21) Appl. No.: 13/895,839

(22) Filed: May 16, 2013

(65) Prior Publication Data

US 2013/0343141 A1 Dec. 26, 2013

(30) Foreign Application Priority Data

Jun. 20, 2012 (JP) ................................. 2012-138681

(51) Int. Cl.
G11C 7/02 (2006.01)
G11C 7/14 (2006.01)
G11C 16/34 (2006.01)
G11C 16/04 (2006.01)
G11C 16/28 (2006.01)

(52) U.S. Cl.
CPC .............. *G11C 7/14* (2013.01); *G11C 16/3445* (2013.01); *G11C 16/0416* (2013.01); *G11C 16/28* (2013.01)

(58) Field of Classification Search
CPC ...... G11C 7/14; G11C 16/3445; G11C 16/28; G11C 16/0416
USPC ............. 365/185.02, 185.29, 210.01, 210.13, 365/200
See application file for complete search history.

(56) References Cited

U.S. PATENT DOCUMENTS

| 5,420,822 A * | 5/1995 | Kato ...................... G11C 16/28 365/185.2 |
| 6,404,666 B1 | 6/2002 | Uchida |
| 6,781,895 B1 * | 8/2004 | Tanaka ................ G06F 11/1008 365/200 |
| 8,179,722 B2 | 5/2012 | Huh |
| 2004/0062072 A1 * | 4/2004 | Tanzawa ...................... 365/145 |
| 2010/0054042 A1 | 3/2010 | Miki |

FOREIGN PATENT DOCUMENTS

| JP | 2001-243783 A | 9/2001 |
| JP | 2010-55679 A | 3/2010 |
| JP | 2010-176832 A | 8/2010 |
| KR | 1020010065273 A | 7/2001 |

OTHER PUBLICATIONS

Korean Office Action with English translation dated Apr. 18, 2014 corresponding to Korean Patent Application No. 10-2013-0067068.

* cited by examiner

*Primary Examiner* — Tha-O H Bui
(74) *Attorney, Agent, or Firm* — Arent Fox LLP

(57) ABSTRACT

A semiconductor memory device including a plurality of memory blocks each including a bit line to which a plurality of memory cells are connected, and a dummy bit line to which a plurality of dummy cells are connected; a reference cell; and a sense amplifier including a first input terminal to which selected memory cell of the plurality of memory cells is to be electrically connected via the bit line, and a second input terminal to which the reference cell is to be electrically connected, the dummy bit line of one memory block of the plurality of memory blocks different from another memory block of the plurality of memory blocks including the selected memory cell being to be electrically connected to the second input terminal of the sense amplifier.

9 Claims, 13 Drawing Sheets

SEMICONDUCTOR MEMORY DEVICE AND ERASURE VERIFICATION METHOD FOR SEMICONDUCTOR MEMORY DEVICE

CROSS-REFERENCE TO RELATED APPLICATION

This application is based upon and claims the benefit of priority of the prior Japanese Patent Application No. 2012-138681, filed on Jun. 20, 2012, the entire contents of which are incorporated herein by reference.

FIELD

The embodiments discussed herein are related to a semiconductor memory device and an erasure verification method for a semiconductor memory device.

BACKGROUND

A semiconductor memory device which can electrically erase information written in the memory cells is proposed.

In such semiconductor memory device, an erasure verification for judging whether or not information stored in a memory cell has been erased is performed.

The erasure verification is performed, e.g., by comparing a current flowing in a memory cell with a current flowing in a reference memory cell for an erasure verification by using a differential sense amplifier or others.

Related references are as follows:
Japanese Laid-open Patent Publication No. 2010-55679;
Japanese Laid-open Patent Publication No. 2001-243783; and
Japanese Laid-open Patent Publication No. 2010-176832.

SUMMARY

According to an aspect of an embodiment, a semiconductor memory device including a plurality of memory blocks each including a bit line to which a plurality of memory cells are connected, and a dummy bit line to which a plurality of dummy cells are connected; a reference cell; and a sense amplifier including a first input terminal to which a selected memory cell of said plurality of memory cells is to be electrically connected via the bit line, and a second input terminal to which the reference cell is to be electrically connected, the dummy bit line of one memory block being to be electrically connected to the second input terminal of the sense amplifier, the one memory block being different from another memory block including the selected memory cell.

According to another aspect of an embodiment, an erasure verification method for a semiconductor memory device, said method including connecting electrically a selected memory cell provided in one memory block of a plurality of memory blocks with a first input terminal of a sense amplifier by a bit line, said plurality of memory blocks each including the bit line to which a plurality of memory cells are connected, and a dummy bit line to which a plurality of dummy cells are connected, connecting electrically a reference cell with a second input terminal of the sense amplifier; connecting electrically the dummy bit line provided in another memory block different from said one memory block with the second input terminal of the sense amplifier; and performing an erasure verification by the sense amplifier.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The proposed semiconductor memory device has not been always sufficiently reliable in the erasure verification.

Figure 11:
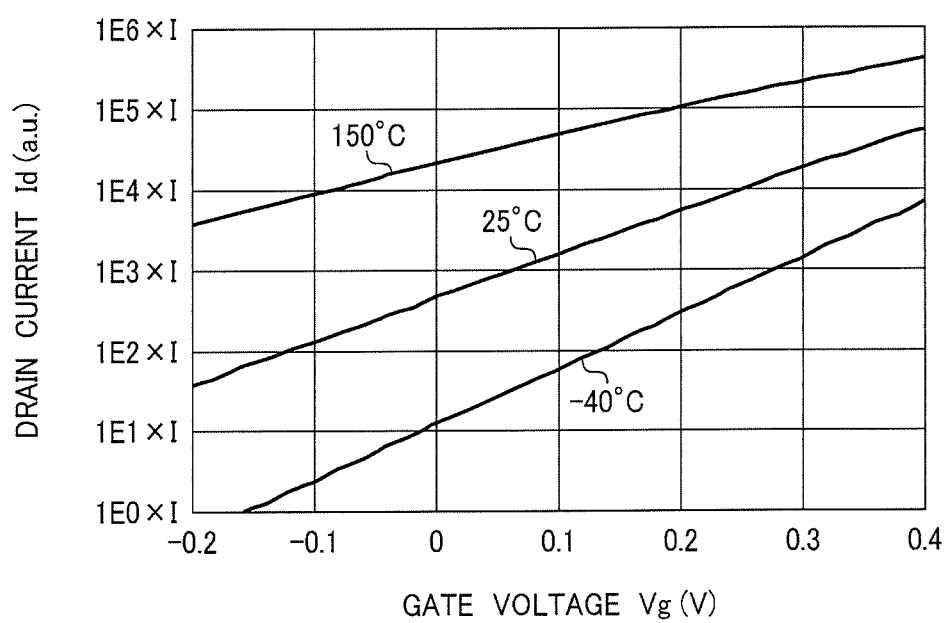
FIG. 11 is a graph of Id-Vg characteristics of the memory cells.

FIG. 11 is a graph of Id-Vg characteristics of a memory cell. More specifically, FIG. 11 is the graph of the Id-Vg characteristics of the memory cell having the threshold voltage set at 1 V. The threshold voltage of 1 V corresponds to the threshold voltage of the soft verification to be described later. In FIG. 11, the gate voltage Vg is taken on the horizontal axis, and on the vertical axis, the drain leak current Id is taken. I on the vertical axis in FIG. 11 is a normalized value. The drain voltage Vd is set at 1 V.

As seen in FIG. 11, near 0 V of the gate voltage Vg, the leak current Id largely varies with the temperature changes.

The leak current Id tends to be larger as the temperature increases.

Figure 12:
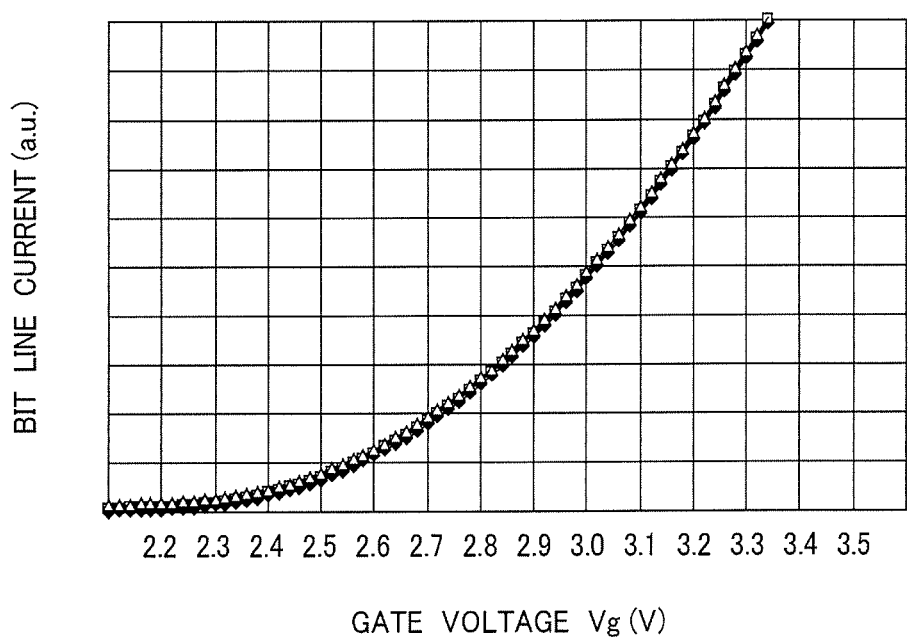
FIGS. 12 and 13 are graphs of simulation results of I-V characteristics of currents flowing in a bit line.
Figure 13:
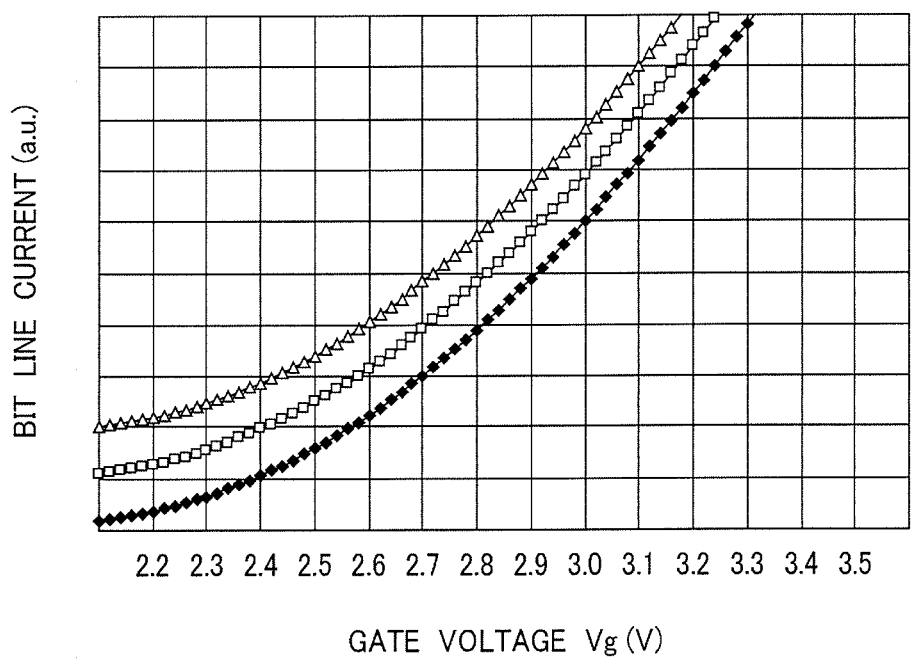

FIG. 12 is a graph of a result of simulating I-V characteristics of a current flowing in a bit line when an ambient temperature is 25° C. FIG. 13 is the graph of the result of simulating the I-V characteristics of the current flowing in the bit lines when the ambient temperature is 150° C. In FIGS. 12 and 13, the gate voltage Vg is taken on the horizontal axis. On the vertical axis in FIGS. 12 and 13, the current flowing in the bit lines are taken. In FIGS. 12 and 13, the ♦ marked plots indicate the case that the threshold voltage of all the memory cells commonly connected to a bit line is set at 3 V. The number of the memory cells commonly connected to the bit line was 64. The ☐ marked plots in FIGS. 12 and 13 indicate the case that 5 memory cells having the threshold voltage set at 1 V are included. The Δ marked plots in FIGS. 12 and 13 indicate the case that 10 memory cells having the threshold voltage set at 1 V are included.

As seen in FIG. 12, when the ambient temperature is about 25° C., the current flowing in the bit line does not substantially vary even in the case that some memory cells whose threshold voltage is low are included.

In contrast to this, as seen in FIG. 13, when the ambient temperature is about 150° C., the current flowing in the bit line increases in the case that memory cells whose threshold voltage is low are connected to the bit line.

As will be described below, in the semiconductor memory device which performs an erasure collectively by one sector (memory block), the threshold voltage varies. The threshold voltage of the memory cells in the erased state vary in the range of, e.g., 1-3 V with the threshold voltage of the erasure verification to be described below set at, e.g., 3 V and the threshold voltage of the soft programming verification to be described below set at, e.g., 1 V.

In erasure verification, a selected memory cell is electrically connected to one input terminal of the differential sense amplifier while the reference cell for erasure verification is electrically connected to the other input terminal of the sense amplifier to compare currents of both. When the current at said one input terminal electrically connected to the selected memory cell is larger than the current in said the other input terminal electrically connected to the reference cell for erasure verification, it is judged that the selected memory cell has been erased.

However, when the threshold voltage of the non-selected memory cells commonly connected to the bit line the selected memory cell is connected to is relatively low, the leak current (column leak current) of such non-selected memory cells cause a negative effect. When a large column leak current flows, there is a risk that even with the drain current of the selected memory cell itself being smaller than the drain current of the reference cell for erasure verification, the erasure verification might be erroneously passed.

As described above, in the proposed semiconductor memory device, erroneous judgment of erasure verifications may take place at high temperatures.

[a] An Embodiment

A semiconductor memory device according to an embodiment, and an erasure verification method for the semiconductor memory device will be described with reference to FIGS. 1 to 10.

(Semiconductor Memory Device)

Figure 1:
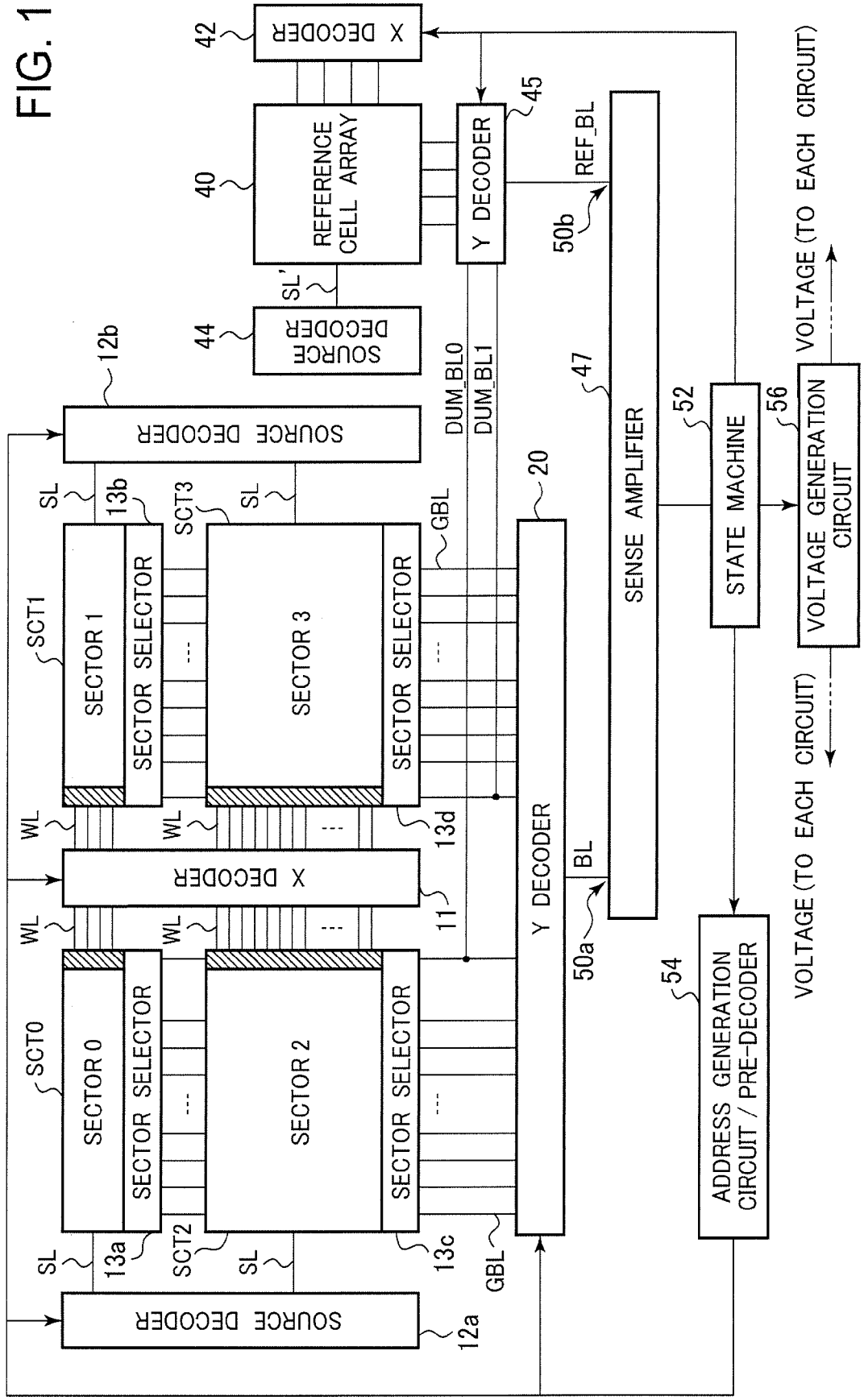
FIG. 1 is a block diagram of the semiconductor memory device according to one embodiment.

First, the semiconductor memory device according to the present embodiment will be described with reference to FIGS. 1 to 8. FIG. 1 is a block diagram of the semiconductor memory device according to the present embodiment. FIGS. 2 to 5 are circuit diagrams of a part of the semiconductor memory device according to the present embodiment.

As illustrated in FIGS. 2 to 5, a plurality of memory cells MC, DC are laid out in a matrix. The plural memory cells MC, DC laid out in the matrix form a memory cell array 10.

The memory cell array 10 is symmetrically laid out, sandwiching an X decoder 11 (row decoder) (see FIG. 1). The memory cell array 10 is divided in plural sectors. In FIG. 1, a sector 0 (SCT0), a sector 1 (SCT1), a sector 2 (SCT2) and a sector 3 (SCT3) are illustrated, but the number of the sectors is not limited to 4.

Figure 2:
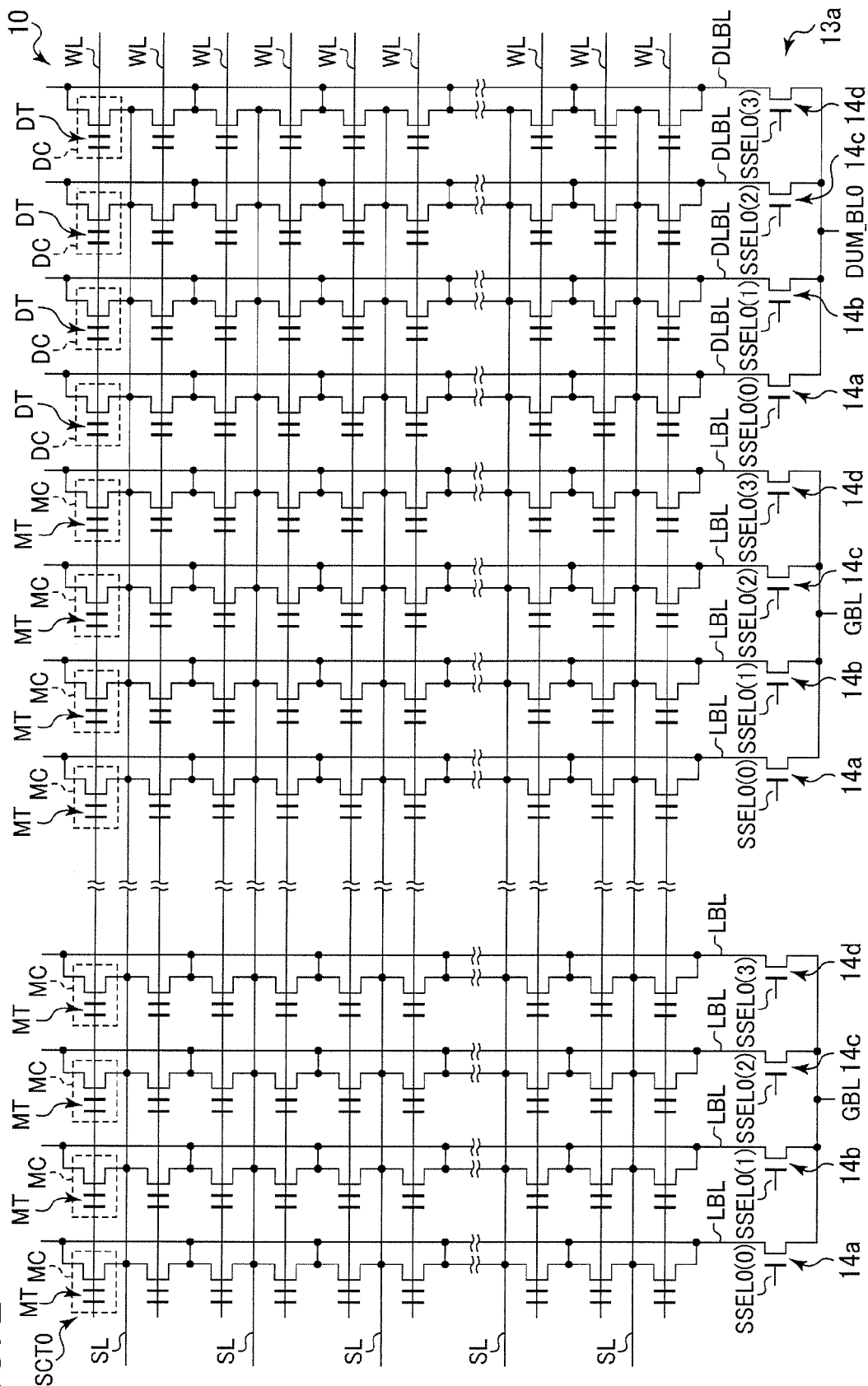
FIGS. 2 to 5 are circuit diagrams of parts of the semiconductor memory device according to one embodiment.

The erasure of information (data) written in the memory cells MC, DC are performed at once by the unit of one sector. FIG. 2 corresponds to the sector 0, FIG. 3 corresponds to the sector 1, FIG. 4 corresponds to the sector 2, and FIG. 5 corresponds to the sector 3.

Most of the memory cells MC of the plural memory cells MC, DC laid out in the matrix are memory cells (real cells) MC to be actually used for storing information. Each memory cell MC is formed of a memory cell transistor MT.

On the other hand, some memory cells DT of the plural memory cells MC, DC laid out in the matrix are not used as the general memory cells MC for storing information but are dummy memory cells (dummy cells) DC to be used for obtaining a desired column leak current.

The dummy cells DC are not different from the memory cells MC in the structure. Most of the plural memory cells MC, DC formed in the matrix are used as the memory cells MC, and the rest of them are used as the dummy cells DC. Thus, the dummy cell DC has the same structure as the memory cell MC. That is, each dummy cell DC is formed of the memory cell transistors (dummy cell transistors) DT of the same structure as the memory cell transistors MT. Thus, each dummy cell DC is formed of the memory cell transistor DT of the same size as the memory cell transistor MT.

As illustrated in FIGS. 2 to 5, the control gates of the plural memory cell transistors MT, DT present in the same row are commonly connected to a word line WL. The plural word lines WL are connected to an X decoder 11 (see FIG. 1).

The sources of the plural memory cell transistors MT, DC present in the same row are commonly connected to a source line SL. The sources of the memory transistors MT, DC in the rows adjacent to each other are connected to a common source line SL. The plural source lines SL are connected to source decoders (row decoders) 12a, 12b.

The drains of the plural memory cell transistors MT present in the same column are commonly connected to a local bit line (bit line) LBL.

The drains of the plural dummy cell transistors DT present in the same column are commonly connected to a dummy local bit line (dummy bit line) DLBL.

The number of the memory cell transistors MT connected to one local bit line LBL and the number of the dummy cell transistors DT connected to one dummy local bit line DLBL are the same. In other words, the number of the memory cells MC connected to one local bit line LBL and the number of the dummy cell DC connected to one dummy local bit line DLBL are the same. Thus, the column leak current flowing in the local bit line LBL and the column leak current flowing in the dummy local bit line DLBL become equal.

The number of the memory cells MC connected to one local bit line LBL is, e.g., 64. The number of the dummy cells DC connected to one dummy local bit line DLBL is also, e.g., 64.

The number of the memory cells MC connected to one local bit line LBL is not limited to 64. The number of the dummy cells DC connected to one dummy local bit line DLBL is not limited to 64 either. For example, the number of the memory cells MC connected to one local bit line LBL may be 128, and the number of the dummy cells DC connected to one dummy local bit line DLBL may be 128. The number of the memory cells MC connected to one local bit line LBL may be 256, and the number of the dummy cells DC connected to one dummy local bit line DLBL may be 256.

As illustrated in FIG. 1, in the respective sectors 0-3, sector selectors 13a-13d are respectively provided.

As illustrated in FIG. 2, in the sector selector 13a, a plurality of transistors 14a-14d are provided. The respective local bit lines LBL and the respective dummy local bit lines DLBL, of the sector 0 are respectively connected to the sources of the plural transistors 14a-14d provided in the sector selector 13a.

The respective local bit lines LBL of the sector are connected to global bit lines (bit lines) GBL respectively via the transistors 14a-14d. Signal lines SSEL0(0)-SSEL0(3) are connected respectively to the gates of the transistors 14a-14d. One of the plural transistors 14a-14d connected to one of the global bit lines GBL is set ON state, whereby one of the local bit lines LBL can be connected to the global bit line GBL.

The respective dummy local bit lines DLBL of the sector 0 are connected to a dummy bit line DUM_BL0 respectively via the transistors 14a-14d. One of the plural transistors 14a-

14d connected to the dummy bit line DUM_BL0 is set ON state, whereby one of the dummy local bit lines DLBL can be connected to the dummy bit line DUM_BL0.

Figure 3:
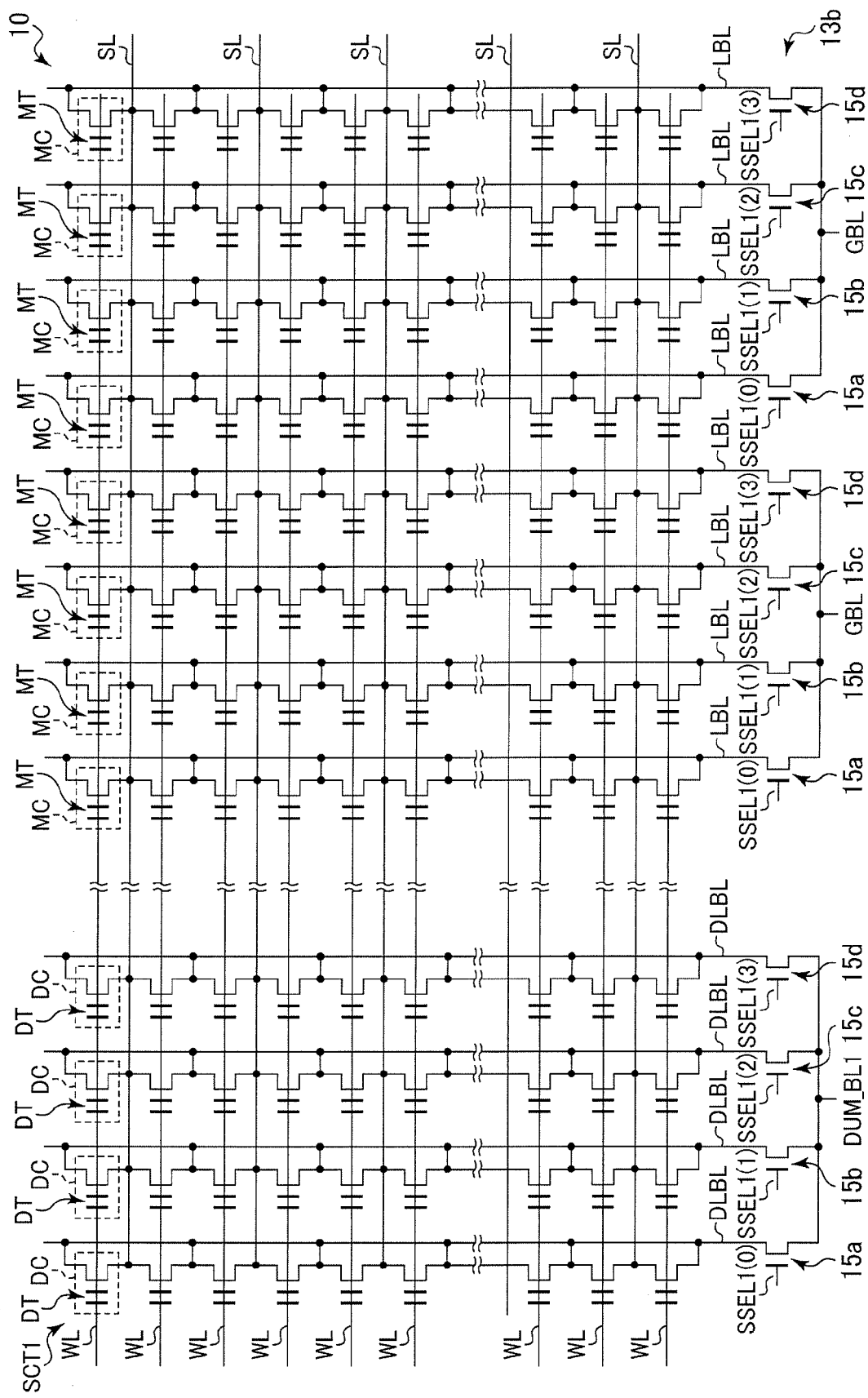

As illustrated in FIG. 3, in the sector selector 13b, a plurality of transistors 15a-15d are provided. The respective local bit lines LBL and the respective dummy local bit lines DLBL, of the sector 1 are respectively connected to the sources of the plural transistors 15a-15d provided in the sector selector 13b.

The respective local bit lines LBL of the sector 1 are connected to global bit lines GBL respectively via transistors 15a-15d. Signal lines SSEL1(0)-SSEL1(3) are respectively connected to the gates of the transistors 15a-15d. One of the plural transistors 15a-15d connected to one of the global bit line GBL is set ON state, whereby one of the local bit line LBL can be connected to the global bit line GBL.

The dummy local bit lines DLBL of the sector 1 are connected to the dummy bit line DUM_BL1 respectively via the transistors 15a-15d. One of the plural transistors 15a-15d connected to a dummy bit line DUM_BL1 is set ON state, whereby one of the dummy local bit lines DLBL can be connected to the dummy bit line DUM_BL1.

Figure 4:
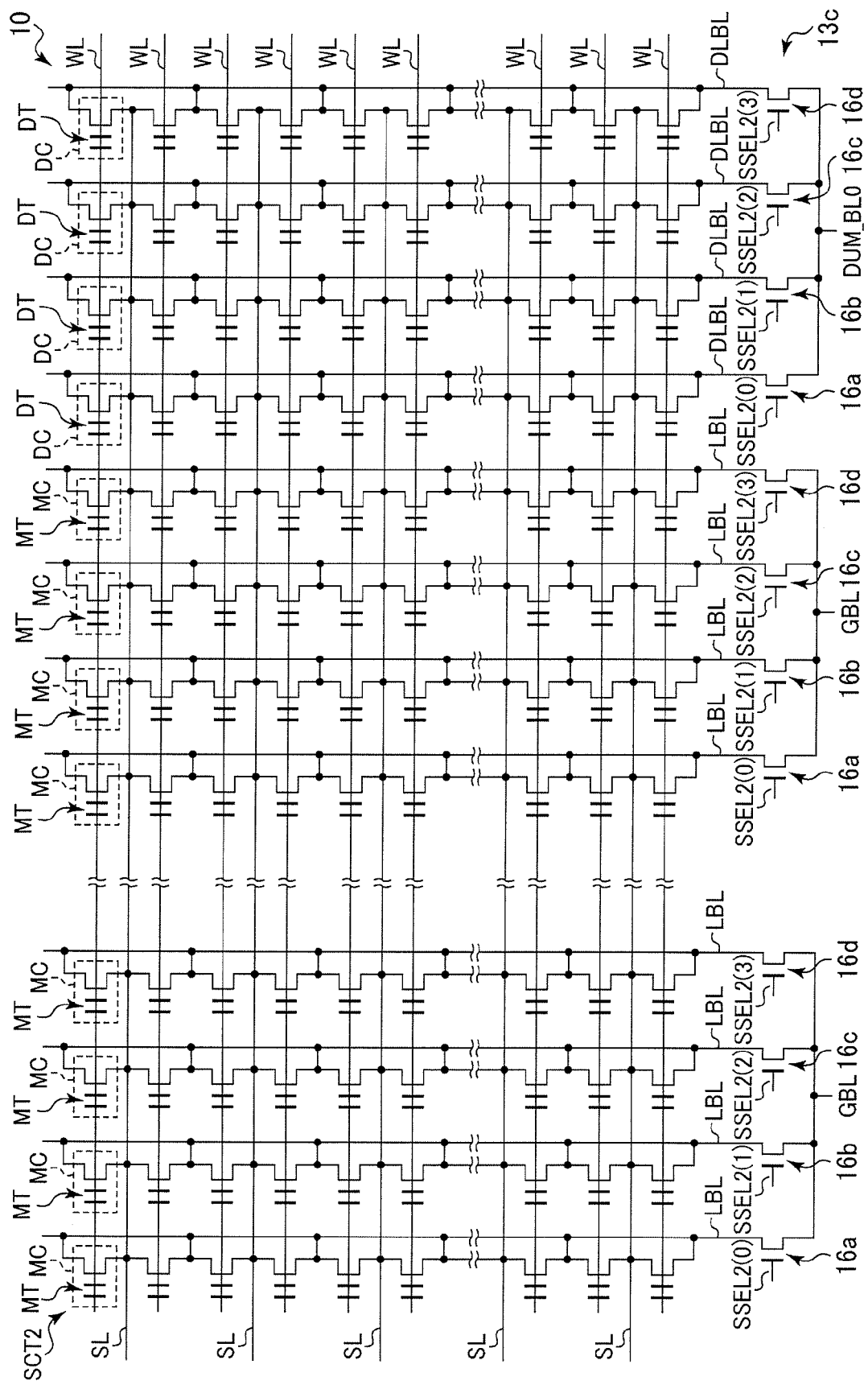

As illustrated in FIG. 4, in the sector selector 13c, a plurality of transistors 16a-16d are provided. The respective local bit lines LBL and the respective dummy local bit lines DLBL, of the sector 2 are respectively connected to the sources of the plural transistors 16a-16d provided in the sector selector 13c.

The respective local bit lines LBL of the sector 2 are connected to global bit lines GBL respectively via the transistors 16a-16d. Signal lines SSEL2(0)-SSEL2(3) are respectively connected to the gates of the transistors 16a-16d. One of the plural transistors 16a-16d connected to one of the global bit lines GBL is set ON state, whereby one of the local bit lines LBL can be connected to the global bit line GBL.

The respective dummy local bit lines DLBL of the sector 2 are connected to a dummy bit line DUM_BL0 respectively via the transistors 16a-16d. One of the plural transistors 16a-16d connected to the dummy bit line DUM_BL0 is set ON state, whereby one of the dummy local bit lines DLBL can be connected to the dummy bit line DUM_BL0.

Figure 5:
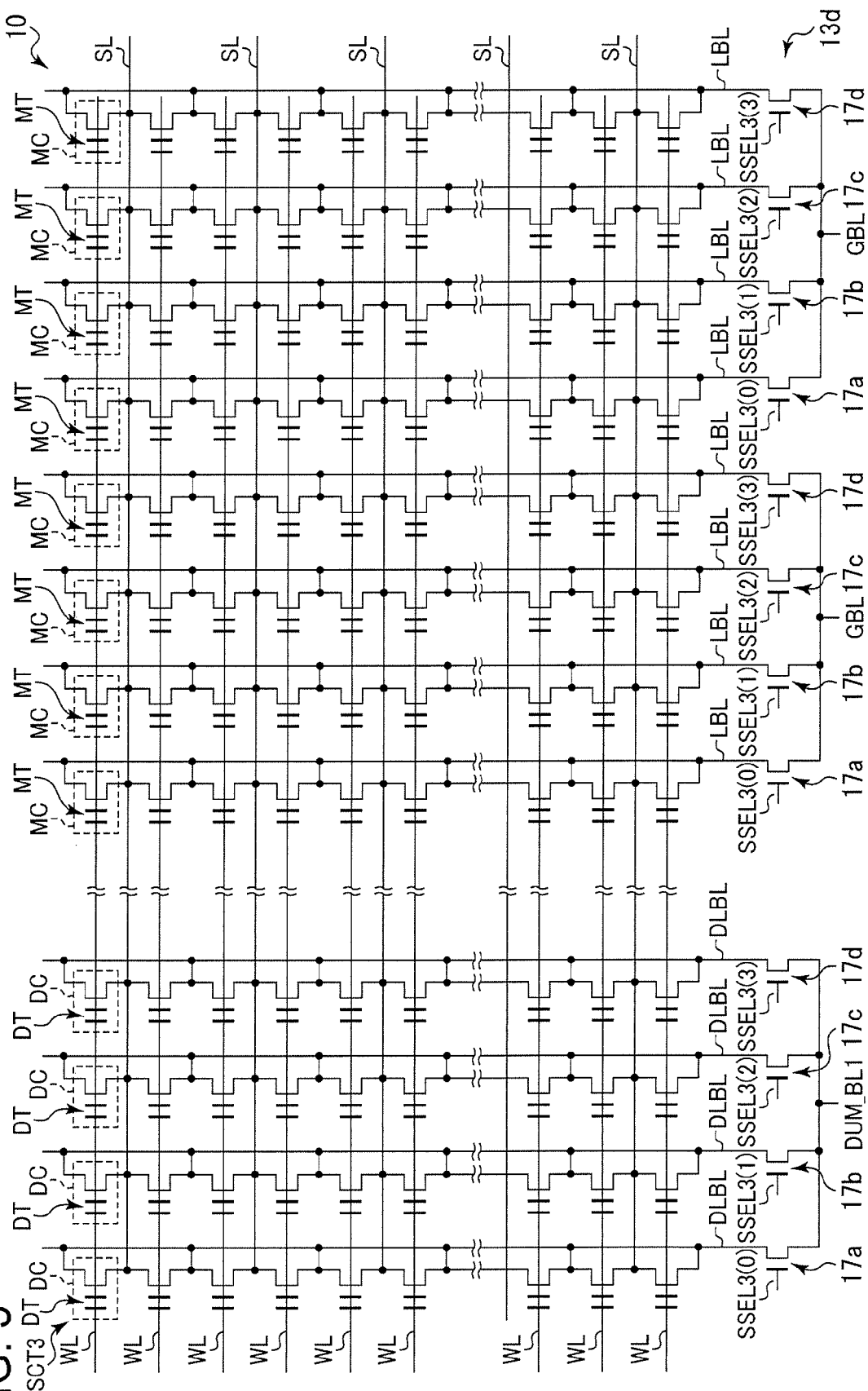

As illustrated in FIG. 5, in the sector selector 13d, a plurality of transistors 17a-17d are provided. The respective local bit lines LBL and the respective dummy local bit line DLBL, of the sector 3 are respectively connected to the sources of the plural transistors 17a-17d provided in the sector selector 13d.

The respective local bit lines LBL of the sector 3 are connected to global bit lines GBL respectively via the transistors 17a-17d. Signal lines SSEL3(0)-SSEL3(3) are respectively connected to the gates of the transistors 17a-17d. One of the plural transistors 17a-17d connected to one of the global bit lines GBL is set ON state, whereby one of the local bit line LBL can be connected to the global bit line GBL.

The local bit lines DLBL of the sector 3 are connected to a dummy bit line DUM_BL1 respectively via the transistors 17a-17d. One of the plural transistors 17a-17d connected to the dummy bit line DUM_BL1 is set ON state, whereby one of the dummy local bit lines DLBL can be connected to the dummy bit line DUM_BL1.

The plural global bit line GBL are connected to a Y decoder (column decoder) 20 for the memory cells. The Y decoder 20 for the memory cell array connects one of the plural global bit lines GBL to a signal line BL.

The signal line BL is connected to one input terminal 50a of a sense amplifier 47. Accordingly, to said one input terminal 50a of the sense amplifier 47, a selected memory cell MC is connected via the local bit line LBL, the global bit line GBL and the signal line BL.

Figure 6A:
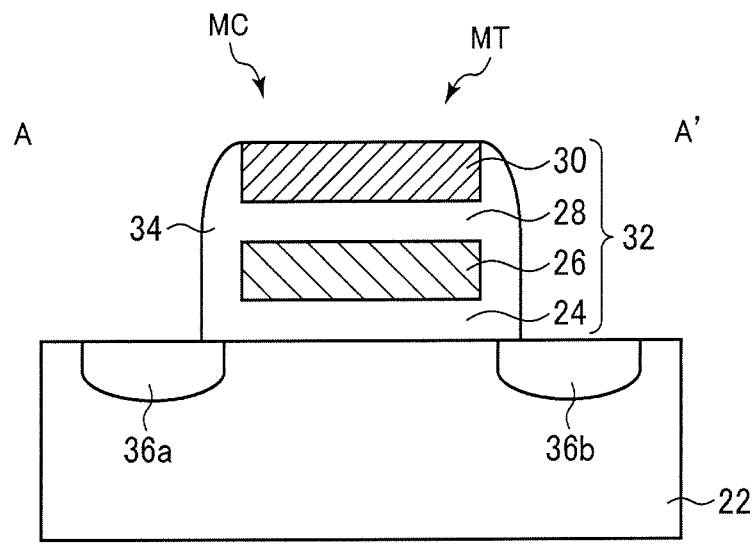
FIG. 6A is a sectional view of a memory cell.
Figure 6B:
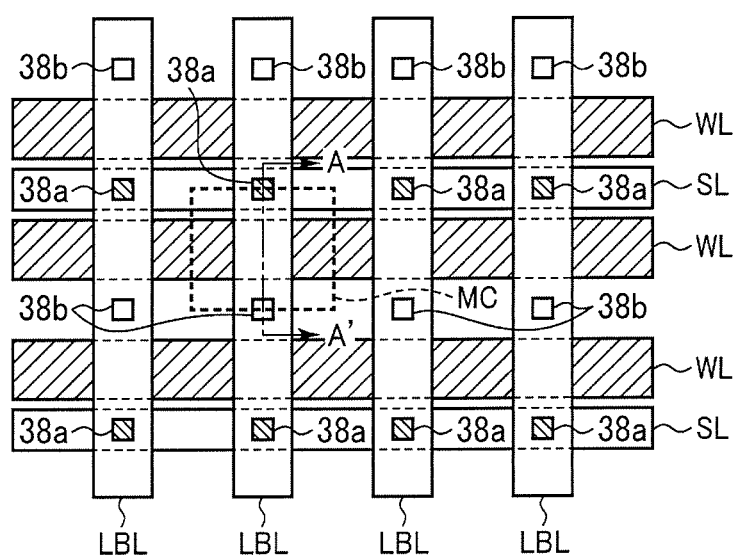
FIG. 6B is a plan view of the memory cell.

FIGS. 6A and 6B are a sectional view and a plan view of a memory cell. FIG. 6B is the plan view, and FIG. 6A is the A-A' line sectional view of FIG. 6B.

As illustrated in FIG. 6A, a tunnel oxide film (gate insulation film) 24 of, e.g., an about 10 nm-film thickness silicon oxide film is formed on a semiconductor substrate 22. On the tunnel oxide film 24, a floating gate 26 of, e.g., polysilicon is formed. On the floating gate 26, an insulation film 28 of, e.g., an about 10 nm-film thickness silicon oxide nitride film is formed. On the insulation film 28, a control gate 30 of, e.g., polysilicon is formed. On the side wall of the layer structure 32 including the tunnel oxide film 24, the floating gate 26, the insulation film 28 and the control gate 30, a sidewall insulation film 34 is formed. In the semiconductor substrate 22 on both sides of the layer structure 32 with the sidewall insulation film 34 formed on, source/drain diffused layers 36a, 36b are formed.

As illustrated in FIG. 6B, a plurality of the word lines WL are formed in parallel with each other. The word lines WL commonly connect the control gates 30 of the memory cell transistors MT present in the same rows. A plurality of source lines SL are formed so that the source lines SL are in parallel with the word lines WL. The source lines SL are electrically connected to the source diffused layer 36a via the contact plugs 38a. A plurality of local bit lines LBL are formed so that the local bit lines LBL are intersecting the word lines WL and the source lines SL. The local bit lines LBL are electrically connected to the drain diffused layer 36b via the contact plugs 38b.

Thus, the memory cell transistors MT forming the memory cells MC are formed.

Figure 7A:
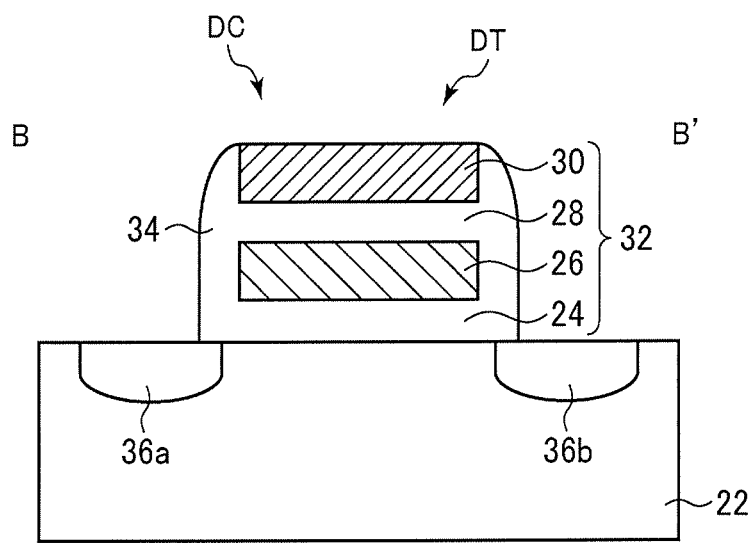
FIG. 7A is a sectional view of a dummy cell.
Figure 7B:
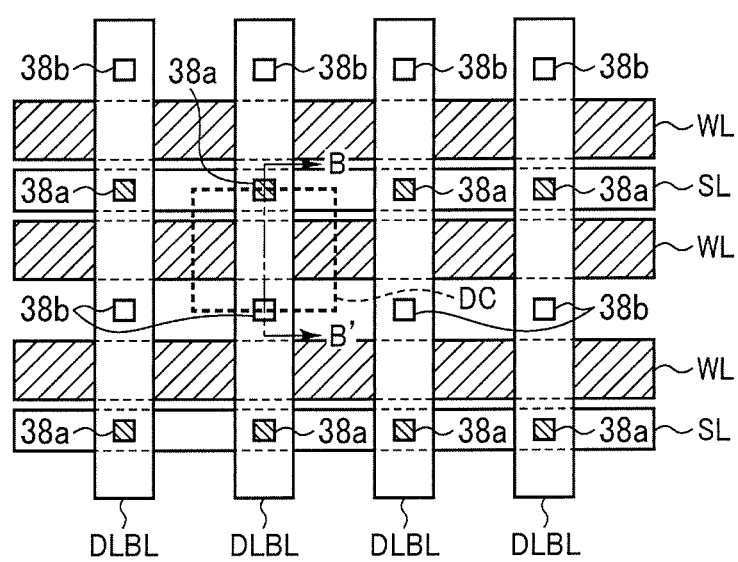
FIG. 7B is a plan view of the dummy cell.

FIGS. 7A and 7B are a sectional view and a plan view of a dummy cell. FIG. 7B is the plan view, and the FIG. 7A is the B-B' line sectional view of FIG. 7B.

As illustrated in FIG. 7A, the tunnel oxide film (gate insulation film) 24 of, e.g., an about 10 nm-film thickness silicon oxide film is formed on the semiconductor substrate 22. On the tunnel oxide film 24, a floating gate 26 of, e.g., polysilicon is formed. On the floating gate 26, the insulation film 28 of, e.g., an about 10 nm-film thickness silicon oxide nitride film is formed. On the insulation film 28, a control gate 30 of, e.g., polysilicon is formed. The sidewall insulation film 34 is formed on the side wall of the layer structure 32 including the tunnel oxide film 24, the floating gate 26, the insulation film 28 and the control gate 30. In the semiconductor substrate 22 on both sides of the layer structure 32 with the sidewall insulation film 34 formed on, source/drain diffused layers 36a, 36b are formed.

As illustrated in FIG. 7B, a plurality of the word lines WL are formed in parallel with each other. The word lines WL commonly connect the control gates 30 of the dummy cell transistors DT present in the same rows. A plurality of source lines SL are formed so that the source lines SL are in parallel with the word lines WL. The source lines SL are electrically connected to the source diffused layers 36a via the contact plugs 38a. A plurality of local dummy bit lines LDBL are formed so that the local dummy bit lines LDBL are intersecting the word lines WL and the source lines SL. The local dummy bit lines LDBL are electrically connected to the drain diffused layers 36b via the contact plugs 38b.

Thus, the dummy cell transistors DT forming the dummy cells DC are formed.

As described above, the dummy cells DC are formed of the memory cell transistors (dummy cell transistors) DT of the same structure as the memory cell transistors MT forming the memory cells MC. In other words, the dummy cells DC are formed of the memory cell transistors (dummy cell transistors) DT of the same size as the memory cell transistors MT forming the memory cells MC.

As illustrated in FIG. 1, a reference cell array 40 is provided separate from the memory cell array 10.

Figure 8:
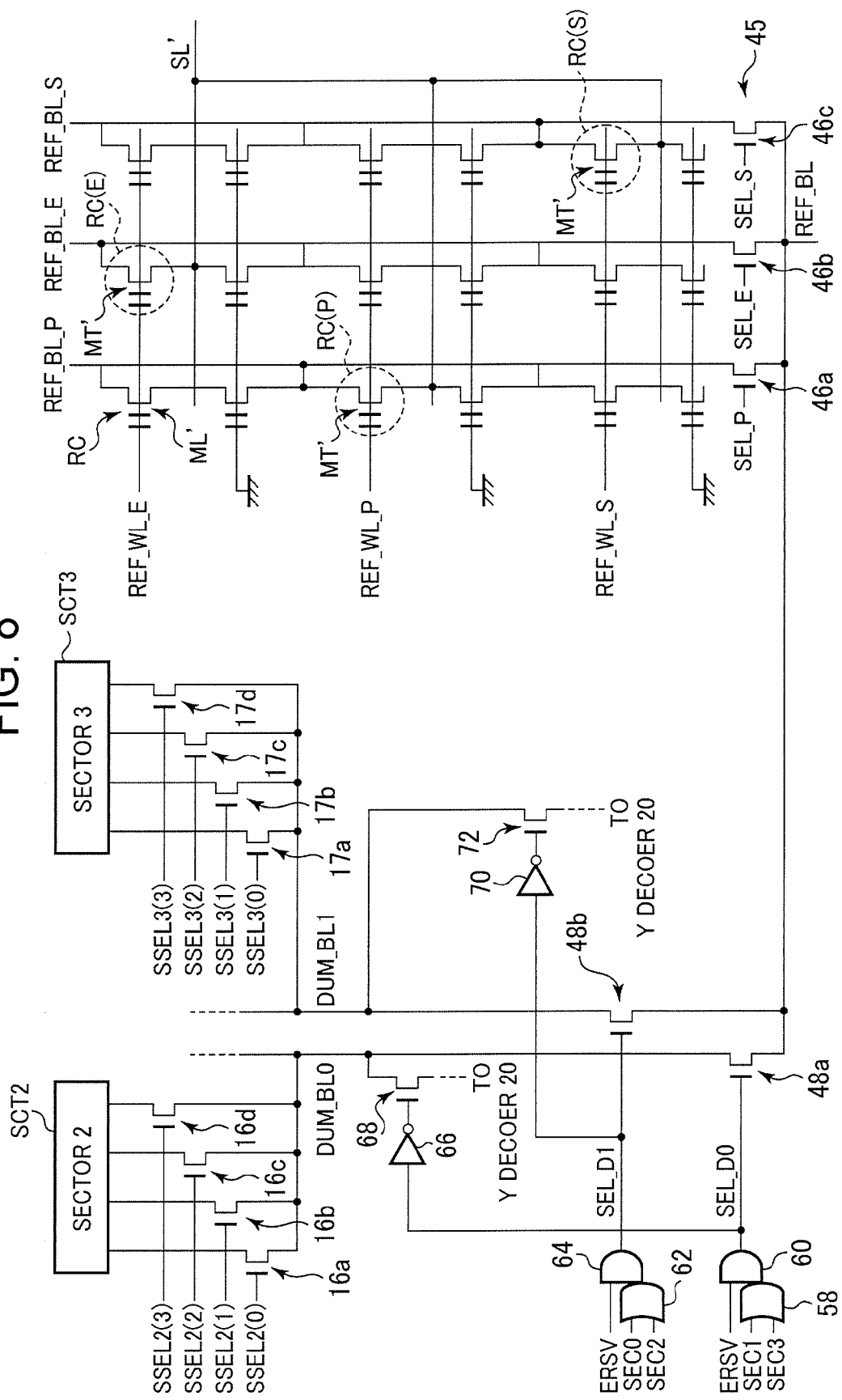
FIG. 8 is a circuit diagram of a part of the semiconductor memory device according to one embodiment.

FIG. 8 is a circuit diagram of a part of the semiconductor memory device according to the present embodiment. In FIG. 8, the sector 0 and the sector 1 are not illustrated.

As illustrated in FIG. 8, a plurality of the reference cells RC are laid out in a matrix. The plural reference cells RC form the reference cell array 40.

One reference cell RC(P) of the plural reference cells RC is a reference cell for the write verification (programming verification). To the gate of the memory cell transistor MT' of the reference cell RC(P) for the programming verification, a word line REF_WL_P for selecting the reference cell RC(P) for the programming verification. The threshold voltage PGMV of the reference cell RC(P) for the programming verification is set at, e.g., about 6 V.

Another reference cell RC(E) of the plural reference cells RC is the reference cell RC(E) for the erasure verification. To the gate of the memory cell transistor MT' of the reference cell RC(E) for the erasure verification, a word line REF_WL_E for selecting the reference cell RC(E) for the erasure verification is connected. The threshold voltage ERSV of the reference cell RC(E) for the erasure verification is set at, e.g., about 3 V.

Further another reference cell RC(S) of the plural reference cells RC is the reference cell for the soft programming verification. To the gate of the memory cell transistor MT' of the reference cell RC(S) for the soft programming verification, a word line REF_WL_S for selecting the reference cell RC(S) for the soft programming verification is connected. The threshold voltage SPGMV of the reference cell RC(S) for the soft programming verification is set at, e.g., about 1 V.

The word lines REF_WL_E, REF_WL_P, REF_WL_S for the reference cell array are connected to an X decoder (row decoder) 42 for the reference cell array.

The sources of the memory cell transistors MT' of the respective reference cells RC(P), RC(E), RC(S) are connected to a source line SL'. The source line SL' is connected to a source decoder (row decoder) 44 (see FIG. 1) for the reference cell array.

To the drain of the reference cell RC(P) for the programming verification, a reference bit line REF_BL_P. The reference cells RC except the reference cell RC(P) for the programming verification are not connected to the reference bit line REF_BL_P.

To the drain of the reference cell RC(E) for the erasure verification, a reference bit line REF_BL_E is connected. The reference cells RC except the reference cell RC(E) for the erasure verification is not connected to the reference bit line REF_BL_E.

To the drain of the reference cell RC(S) for the soft programming verification, a reference bit line REF_BL_S is connected. The reference cells RC except the reference cell RC(S) for the soft programming verification is not connected are not connected to the reference bit line REF_BL_S.

The reference bit lines REF_BL_P, REF_BL_E, REF_BL_S are connected to a Y decoder (column decoder) 45 (see FIG. 1) for the reference cell array. More specifically, the reference bit lines REF_BL_P, REF_BL_E, REF_BL_S are respectively connected to the sources of a plurality of transistors 46a-46c provided in the Y decoder 45 for the reference cell array. The drains of the plural transistors 46a-46c are connected to a signal line REF_BL. To the gates of the plural transistors 46a-46d, signal lines SEL_P, SEL_E, SEL_S are respectively connected. One of the plural transistors 46a-46c is set ON state, whereby one of the reference bit lines REF_BL_P, REF_BL_E, REF_BL_S can be connected to the signal line REF_BL.

The Y decoder 45 for the reference cell array sets one of the plural transistors 46a-46c to ON state, whereby one of the reference cells RC(P), RC(E), RC(S) can connected to the signal line REF_BL. As illustrated in FIG. 1, the signal line REF_BL is connected to an input terminal 50b of the sense amplifier 47.

As illustrated in FIG. 8, dummy bit lines DEM_BL0, DEM_BL1 are respectively connected to the sources of transistors 48a, 48b. The drains of the transistors 48a, 48b are connected to the signal line REF_BL. Signals SEL_D0, SEL_D1 are respectively inputted to the gates of the transistors 48a, 48b. In FIG. 1, the transistors 48a, 48b are not illustrated.

The signals SEL_D0, SEL_D1 are generated by the following logic circuit.

That is, the signal SEL_D0 is generated by the logic circuit combining an OR gate 58 and an AND gate 60. To the input terminal of the OR gate 58, a signal SEC1 and a signal SEC3 are inputted. The signal SEC1 becomes H (High) level when the sector 1 is selected. The signal SEC3 becomes H level when the sector 3 is selected. To the input terminal of the AND gate 60, the output signal of the OR gate 58 and a signal ERSV are inputted. The output signal of the OR gate 58 become H level when the sector 1 or the sector 3 is selected. The signal ERSV becomes H level when the erasure verification is performed. Accordingly, the signal SEL_D0 becomes H level when the sector 1 or the sector 3 is selected, and the erasure verification is performed.

The signal SEL_D1 is generated by the logic circuit combining an OR gate 62 and an AND gate 64. To the input terminal of the OR gate 62, a signal SEC0 and a signal SEC2 are inputted. The signal SEC0 becomes H level when the sector 0 is selected. The signal SEC2 becomes H level when the sector 2 is selected. To the input terminal of the AND gate 64, the output signal of the OR gate 62 and a signal ERSV are inputted. The output signal of the OR gate 62 becomes H level when the sector 0 or the sector 2 is selected. The signal ERSV becomes H level when the erasure verification is performed. Accordingly, the signal SEL_D1 becomes H level when the sector 0 or the sector 2 is selected, and the erasure verification is performed.

To the gates of the transistors 48a, 48b, such signals SEL_D0, SEL_D1 are respectively inputted. Accordingly, the transistor 48a becomes ON state when the sector 1 or the sector 3 is selected, and the erasure verification is performed. Since the transistor 48a becomes ON state, whereby the dummy bit line DEM_BL0 on the side of the sector 0 or the sector 2 is connected to the signal lines REF_BL. On the other hand, since the transistor 48b becomes OFF state, whereby the dummy bit line DEM_BL1 on the side of the sector 1 or the sector 3 is not connected to the signal lines REF_BL. Thus, when the erasure verification for the memory cells MC on the side of the sector 1 or the sector 3 is performed, the dummy bit line DEM_BL0 on the side of the sector 0 or the sector 2 is connected to the signal lines REF_BL.

When the sector 0 or the sector 2 is selected, and the erasure verification is performed, the transistor 48b becomes ON state. The transistor 48b becomes ON state, whereby the dummy bit line DEM_BL1 on the side of the sector 1 or the sector 3 is connected to the signal lines REF_BL. On the other hand, the transistor 48a is OFF state. Accordingly, the dummy bit line DEM_BL0 on the side of the sector 0 or the sector 2 is not connected to the signal line REF_BL. Thus, when the erasure verification is performed for the memory cells MC on the side of the sector 0 or the sector 2, the dummy bit line DEM_BL1 on the side of the sector 1 or the sector 3 is connected to the signal lines REF_BL.

In FIG. 1, the OR gates 58, 62 and the AND gates 60, 64 are not illustrated.

The signal SEL_D0 is connected not only to the gate of the transistor 48a but also to the input terminal of an inverter 66. The output terminal of the inverter 66 is connected to the gate of a transistor 68. The source of the transistor 68 is connected to the dummy bit line DUM_BL0, and the drain of the transistor 68 is connected to a Y decoder 20. Thus, except when the erasure verification is performed on the side of the sector 1 or the sector 3, the dummy bit line DUM_BL0 is connected to the Y decoder 20.

The signal SEL_D1 is connected not only to the gate of the transistor 48b but also to the input terminal of an inverter 70. The output terminal of the inverter 70 is connected to the gate of a transistor 72. The source of the transistor 72 is connected to the dummy bit line DUM_BL1, and the drain of the transistor 72 is connected to the Y decoder 20. Thus, except when the erasure verification is performed on the side of the sector 0 or the sector 2, the dummy bit line DUM_BL1 is connected to the Y decoder 20.

As described above, the dummy bit line DUM_BL0 is connected to the signal lines REF_BL only when the erasure verification is performed for the memory cells MC on the side of the sector 1 or the sector 3. The dummy bit line DUM_BL1 is connected to the signal lines REF_BL only when the erasure verification is performed for the memory cells MC on the side of the sector 0 or the sector 2. When the programming verification and the soft programming verification are performed, the dummy bit lines DUM_BL0, DUM_BL1 are not connected to the signal line REF_BL.

In FIG. 1, the inverters 66, 70 and the transistors 68, 72 are not illustrated.

The sense amplifier 47 is a differential sense amplifier. To said one input terminal 50a of the sense amplifier 47, a selected memory cell MC is to be electrically connected via selected bit lines LBL, GBL, etc. To said the other input terminal 50b of the sense amplifier 47, the selected reference cell RC(P), RC(E), RC(S) is suitably connected electrically via the selected reference bit line REF_BL_P, REF_BL_E, REF_BL_S, etc. When the erasure verification is performed, to said the other input terminal 50b of the sense amplifier 47, the dummy cell DC is electrically connected via the selected dummy bit line DLBL, etc. The sense amplifier 47 compares a current flowing in said one input terminal 50a electrically connected to the memory cell MC with a current flowing in said the other input terminal 50b electrically connected to the reference cell RC. In other words, the sense amplifier 47 compares a voltage (potential) of said one input terminal 50a electrically connected to the memory cell MC with a voltage (potential) of said the other input terminal 50b electrically connected to the reference cell RC. The sense amplifier 47 judges whether or not the erasure verification is passable, based on a result of the comparison in the current or the voltage between said one input terminal 50a and said the other input terminal 50b.

The erasure verification is judged to have passed when the current of said one input terminal 50a electrically connected to the memory cell MC is larger than a current of said the other input terminal 50b electrically connected to the reference cell RC(E).

On the other hand, a current of said one input terminal 50a electrically connected to the memory cell MC is smaller than a current of said the other input terminal 50b electrically connected to the reference cell RC(E), the erasure verification is judged to have failed.

A judgment result of pass or failure of the verification by the sense amplifier 47 is inputted into a state machine (control unit, control circuit) 52.

The state machine 52 generally controls the semiconductor memory device according to the present embodiment. The state machine 52 outputs a signal to an address generation circuit/pre-decoder 54. When the verification has passed, the state machine 52 increases the value of the address and outputs the increased address signal to the address generation circuit/pre-decoder 54.

Based on a signal from the state machine 52, the address generation circuit/pre-decoder 54 outputs a signal to the X decoder 11, the Y decoder 20, the source decoders 12a, 12b, etc.

The state machine 52 output a control signal also to the X decoder 42, the source decoder 44, the Y decoder, etc. for the reference cell array.

The state machine 52 outputs a control signal also to a voltage generation circuit (power supply circuit) 56.

The voltage generation circuit 56 supplies a power source to the respective circuits.

Thus, the semiconductor memory device according to the present embodiment is formed.

(Erasing Method)

Figure 9:
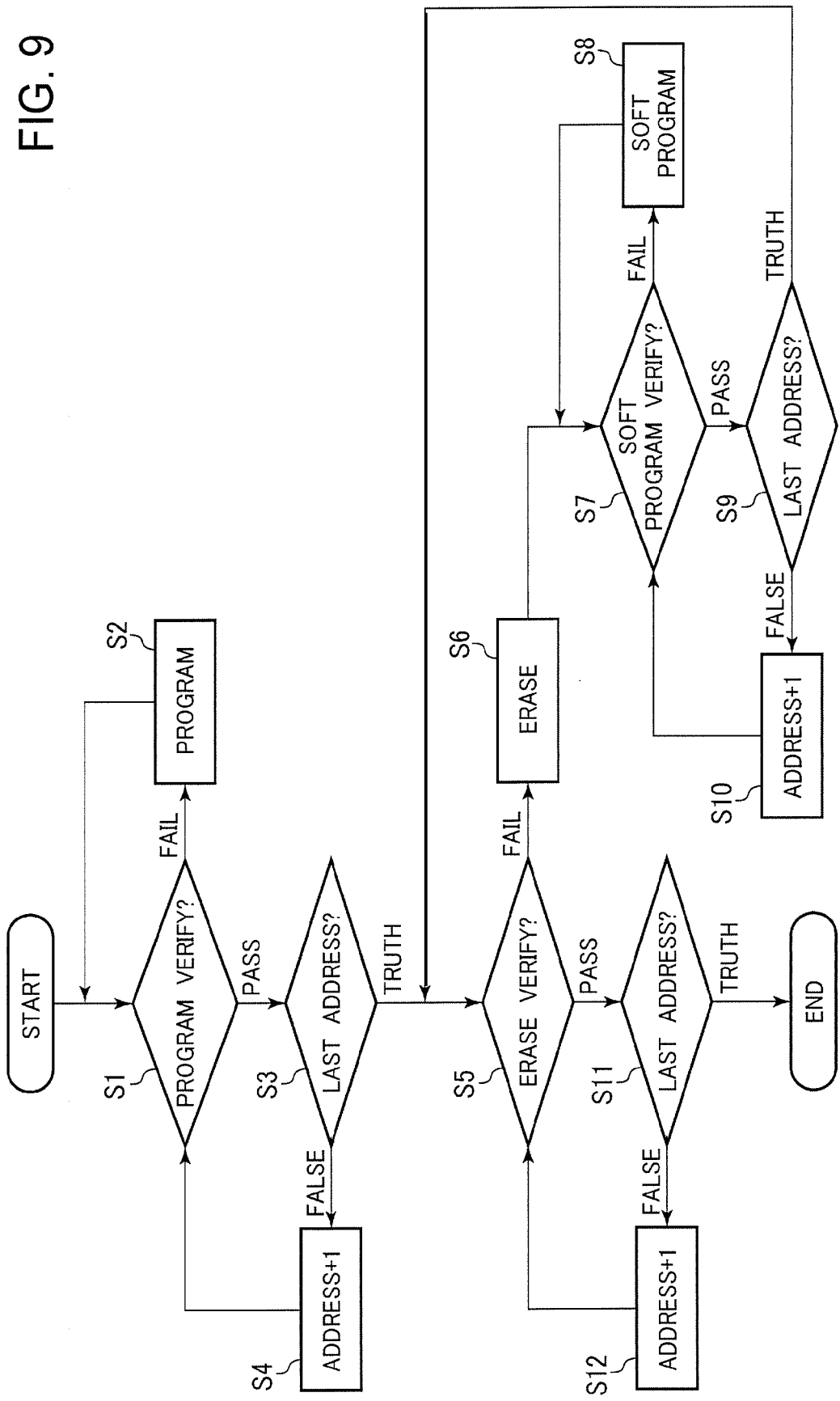
FIG. 9 is a flow chart of an erasing method of the semiconductor memory device according to one embodiment.

Next, the erasing method of the semiconductor memory device according to the present embodiment will be described with reference to FIGS. 1 to 10. FIG. 9 is a flow chart of the erasing method of the semiconductor memory device according to the present embodiment.

The erasure of information written in the memory cell array 10 of the semiconductor memory device is performed collectively by one sector (memory block), as described above.

The erasing method will be described here by means of the case that information written in memory cells MC present in the sector 2 is first erased, and then information written in memory cells MC present in the sector 3 is erased.

The information written in the memory cells MC present in the sector 2 is erased as follows.

First, before the sequence of erasures of erasing information written in memory cells MC in the sector 2, the sequence of preprogrammings of writing in, i.e., programming, all the memory cells MC in the sector is performed. The reason why the preprogramming is performed before the information of the memory cells MC is erased, there is the risk that some of the memory cells MC will have the information excessively erased under the mixed presence of memory cells MC having the information erased and memory cells MC having information written in.

In the sequence of preprogrammings, the programming verification (write verification) is performed as follows for all the memory cells MC in the sector 2 (Step S1). When the programming verification is performed, the word line WL connected to the gate of the memory cell transistor MT of memory cell MC which is the target of the programming verification is selected by the X decoder 11. Specifically, the potential of the word line WL connected to the gate of the memory cell transistor MT of the memory cell MC which is the target of the programming verification is set H level, and the potential of the word lines WL except said word lines WL is set L (Low) level. The potential of the word line WL of H level, i.e., the potential of the selected word line WL is, e.g., about 6 V. The potential of the word line WL of L level, i.e., the potential of the non-selected word line WL is, e.g., about 0 V. The source line SL of the memory cell transistor MT of the memory cell MC which is the target of the programming verification is grounded (0V) by the source decoder 12a. The local bit line LBL connected to the drain of the memory cell transistor MT of the memory cell MC which is the target of the programming verification is selected by the sector selector 13c and the Y decoder 20. Specifically, one of a plurality of the transistors 16a-16d provided in the sector selector 13c is set ON state, whereby the local bit line LBL is selected. One of the plural transistors (not illustrated) provided in the Y decoder 20 is set ON state, whereby the selected local bit line LBL is connected to the signal line BL. Thus, the drain of the memory cell transistor MT of the memory cell MC which is the target of the programming verification is connected to one input terminal 50a of the sense amplifier 47 via the selected global bit line GBL and the signal line BL.

In the programming verification, the word line REF_WL_P connected to the gate of the memory cell transistor MT' of the reference cell RC(P) for the programming verification is selected by the X decoder 42. Specifically, the potential of the word line REF_WL_P connected to the gate of the memory cell transistor MT' of the reference cell RC(P) for the programming verification is set H level, and the potential of the word line REF_WL_E, REF_WL_S except said word line REF_WL_P is set L level. The source line SL' connected to the source of the memory cell transistor MT' of the reference cell RC(P) for the programming verification is grounded (0V) by the source decoder 44. The reference bit line REF_BL_P connected to the drain of the memory cell transistor MT' of the reference cell RC(P) for the programming verification is selected by the Y decoder 45. Specifically, the transistor 46a is set ON state, and the transistors 46b, 46c are set OFF state, whereby the reference bit line REF_BL_P is selected. Thus, the drain of the memory cell transistor MT' of the reference cell RC(P) for the programming verification is connected to the other input terminal 50b of the sense amplifier 47 via the reference bit line REF_BL_P and the signal line REF_BL. In the programming verification, the transistors 48a, 48b are OFF state, whereby the dummy bit lines DUM_BL0, DUM_BL1 are not connected to the signal line REF_BL.

When the threshold voltage of the memory cell transistor MT of the memory cell MC which is the target of the programming verification is lower than the threshold voltage of the memory cell transistor MT' of the reference cell RC(P) for the programming verification, the programming verification fails. On the other hand, the threshold voltage of the memory cell transistor MT of the memory cell MC which is the target of the programming verification is higher than the threshold voltage PGMV of the memory cell transistor MT' of the reference cell RC(P) for the programming verification, the programming verification passes.

The pass and failure of the programming verification is judged by the differential sense amplifier 47. Specifically, first, the bit lines LBL, GBL, BL connected to the selected memory cells MC and the bit lines REF_BL_P, REF_BL connected to the reference cell RC(P) are pre-charged. The currents or the voltages of the input terminal 50a electrically connected to the selected memory cells MC and of the input terminal 50b electrically connected to the reference cell RC(P) are compared by the sense amplifier 47. When the current flowing in the input terminal 50a electrically connected to the memory cells MC is larger than the current flowing in the input terminal 50b electrically connected to the reference cell RC(P), the programming verification fails.

When the result of the programming verification fails, the sense amplifier 47 outputs a signal indicating the failure to the state machine 52.

When the result of the programming verification fails, the programming (write) is performed for the memory cell MC (Step S2).

Then, the programming verification is performed again for the memory cell MC, for which the programming has been performed (Step S1).

When the current flowing in the input terminal 50a electrically connected to the memory cell MC is smaller than the current flowing in the input terminal 50b electrically connected to the reference cell RC(P), the programming verification passes.

When the result of the programming verification passes, it is judged whether or not the address of the memory cell MC is the last address (Step S3). When the address of the memory cell MC is not the last address (False), 1 is added to the address (address+1) (Step S4), and the programming verification is performed for the memory cell MC of the next address (Step S1).

When the programming verification for the memory cell MC of the last address is completed (Truth), the sequence of the preprogrammings is completed.

Figure 10:
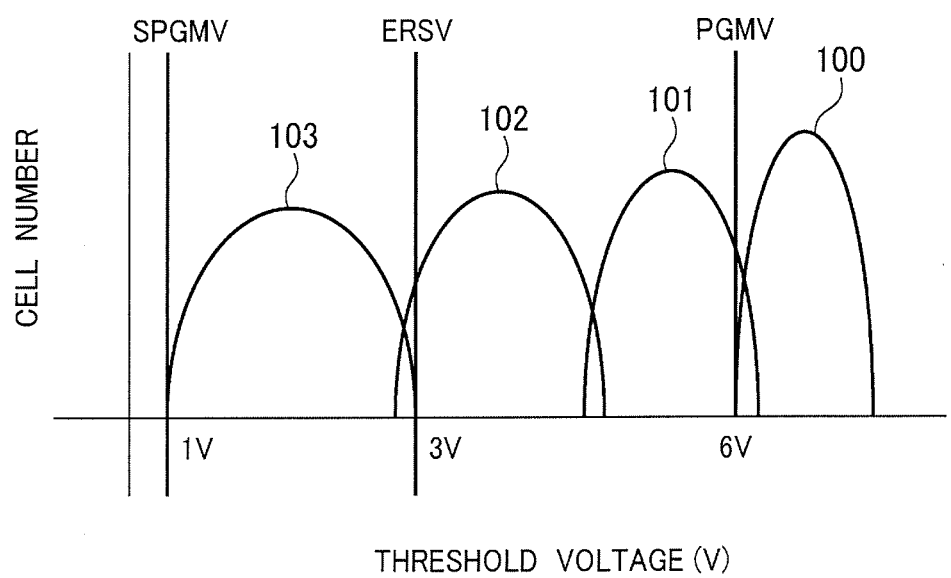
FIG. 10 is a graph of a distribution of threshold voltages of the memory cells.

FIG. 10 is a graph of a distribution of the threshold voltages of the memory cells. In FIG. 10, the threshold voltage is taken on the horizontal axis, and on the vertical axis, the cell number is taken.

As illustrated in FIG. 10, in the step where the sequence of the preprogrammings has been completed, the threshold voltages of the memory cells MC, DC in the sector 2 are higher than the threshold voltage PGMV of the reference cell RC(P) (Distribution 100).

After the sequence of the preprogrammings has been completed, the sequence of erasures follows.

In the sequence of erasures, the erasure verification is performed as follows (Step S5).

The word line WL connected to the gate of the memory cell transistor MT of a memory cell MC which is the target of the erasure verification is selected by the X decoder 11. Specifically, the potential of the word line WL connected to the gate of the memory cell transistor MT of the memory cell MC which is the target of the erasure verification is set H level, and the potential of the word lines WL except said word line WL is set L level. The source line SL of the memory cell transistor MT of the memory cell MC which is the target of the erasure verification is grounded (0 V) by the source decoder 12a. The local bit line LBL connected to the drain of the memory cell transistor MT of the memory cell MC which is the target of the erasure verification is selected by the sector selector 13c and the Y decoder 20. Specifically, one of the plural transistors 16a-16d provided in the sector selector 13c is set ON state, whereby the local bit line LBL is selected. One of the plural transistors (not illustrated) provided in the Y decoder 20 is set ON state, whereby the selected local bit line LBL is connected to the signal line BL. Thus, the drain of the memory cell transistor MT of the memory cell MC which is the target of the erasure verification is connected to one input terminal 50a of the sense amplifier 47 via the selected local bit line LBL, the selected global bit line GBL and the signal line BL.

In the erasure verification, the word line REF_WL_E connected to the gate of the memory cell transistor MT' of the reference cell RC(E) for the erasure verification is selected by the X decoder 42. Specifically, the word line REF_WL_E connected to the gate of the memory cell transistor MT' of the reference cell RC(E) for the erasure verification is set H level, and the word lines REF_WL_P, REF_WL_S except said word line are set L level. The source line SL' connected to the source of the memory cell transistor MT' of the reference cell RC(E) for the erasure verification is grounded (0 V) by the source decoder 44. The reference bit line REF_BL_E connected to the drain of the memory cell transistor MT' of the reference cell RC(E) for the erasure verification is selected by the Y decoder 45. Specifically, the transistor 46b is set ON state and the transistors 46a, 46c are set OFF state, whereby the reference bit line REF_BL_E is selected. Thus, the drain of the memory cell transistor MT' of the reference cell RC(E) for the erasure verification is connected to the other input terminal 50b of the sense amplifier 47 via the reference bit line REF_BL_E and the signal line REF_BL.

When the erasure verification is performed for the memory cell MC of the sector 2, since the transistor 48b becomes ON state, and the dummy bit line DUM_BL1 is connected to the signal line REF_BL. Accordingly, the plural dummy cells DC provided in the sector 3 are connected to the signal line REF_BL via the dummy local bit lines DLBL and the dummy bit line DUM_BL1. The dummy cells DC in the sector 3 have been set erased state in advance. The potentials of the word lines WL connected to the gates of the memory cell transistors DT of the dummy cells DC in the sector 3 (DCT3) are all set L level (0 V). Accordingly, in the signal line REF_BL electrically connected to the plural dummy cells DC provided in the sector 3, column leak currents by the dummy cells DC flow. Since the transistor 48a is OFF state, the dummy bit line DUM_BL0 is not connected to the signal line REF_BL. As described above, in the erasure verification, not only the reference cell RC(E) for the erasure verification but also the dummy cells DC in the sector 3 different from the sector 2 which is the target of the erasure are electrically connected to the input terminal 50b of the sense amplifier 47.

When the threshold voltage of the memory cell transistor MT of a selected memory cell MC which is the target of the erasure verification is higher than the threshold voltage ERSV of the memory cell transistor MT' of the reference cell RC(E) for the erasure verification, the erasure verification fails. On the other hand, when the threshold voltage of the memory cell transistor MT of the selected memory cell MC which is the target of the erasure verification is lower than the threshold voltage ERSV of the memory cell transistor MT' of the reference cell RC(E) for the erasure verification, the erasure verification passes. The pass and failure of the erasure verification is judged by comparing currents or voltages between the input terminal 50a of the sense amplifier 47 connected to a memory cell MC and the input terminal 50b of the sense amplifier 47 connected to the reference cell RC(E). For example, when the current flowing in the input terminal 50a of the sense amplifier 47 connected to a memory cell MC which is the target of the erasure verification is larger than the current flowing in the input terminal 50b of the sense amplifier 47 connected to the reference cell RC(E) for the erasure verification, the erasure verification passes. On the other hand, the current flowing in the input terminal 50a of the sense amplifier 47 connected to a memory cell MC which is the target of the erasure verification is smaller than the current flowing in the input terminal 50b of the sense amplifier 47 connected to the reference cell RC(E) for the erasure verification, the erasure verification fails.

In the input terminal 50a of the sense amplifier 47 electrically connected to a selected memory cell MC, not only the current flowing in the selected memory cell MC but also the leak currents by plural non-selected memory cell MC commonly connected by the local bit lines LBL flow. Such leak currents (column leak currents) tend to become larger as the temperature rises. Accordingly, when the current in the input terminal 50a electrically connected to a selected memory cell MC and the current in the input terminal 50b simply electrically connected to the reference cell RC(E) for the erasure verification are compared with each other, there is the risk that erroneous judgment of the erasure verification will take place at high temperatures. That is, there is the risk that although the erasure is insufficient in a selected memory cell MC, the current in the input terminal 50a electrically connected to the selected memory cell MC will become large, there is a risk that the erasure verification might be erroneously passed.

In the present embodiment, however, in the erasure verification, the dummy local bit lines DLBL commonly connecting the non-selected dummy cells DC provided in the sector 3 different from the sector 2 for the erasure verification are electrically connected to the input terminal 50b of the sense amplifier 47. Accordingly, the leak currents by the plural non-selected dummy cells DC commonly connected to the dummy local bit lines DLBL flow in the input terminal 50b of the sense amplifier 47. Accordingly, the influence of the leak currents of the plural non-selected memory cells MC electrically connected to the input terminal 50a can be compensated by the leak currents of the plural non-selected dummy cells DC electrically connected to the input terminal 50b. Thus, according to the present embodiment, the erroneous judgment of the erasure verification can be prevented although the information of the selected memory cell MC has not been sufficiently erased.

As illustrated in FIG. 10, in the step after the preprogramming and before the erasure, the threshold voltages of the memory cells MC, DC present in the sector are distributed in Distribution 100. The threshold voltages of the memory cells MC, DC present in the sector 2 are all higher than the threshold voltage ERSV of the reference cell RC(E) for the erasure verification, and the erasure verification fails.

When a result of the erasure verification is failure, the sense amplifier 47 outputs a signal indicating the failure to the state machine 52.

When a result of the erasure verification is failure, the information written in the memory cell MC is erased (Step S6). The erasure of the information written in the memory cells MC is performed collectively by the unit of one sector as described above. The erasure is performed collectively for all the memory cells MC in the sector 2 here. The erasure of the information written in all the memory cells MC in the sector 2 is performed by setting the potentials of all the word lines WL in the sector 2 negative and setting the well (not illustrated) of the sector 2 at a positive potential. The potentials of all the word lines WL of the sector 2 are set at, e.g., −10 V here. The potential of the well of the sector 2 is set at, e.g., 10 V here. The voltage for the erasure is applied in pulses for a prescribed period of time (erasure pulse).

After the erasure, soft programming is performed as follows for the memory cells MC whose information has been excessively erased, i.e., the excessively erased memory cells MC. In the soft programming, a moderate writing is performed with an excessively erased memory cell MC, whereby the threshold voltage of the memory cell transistors MT of such memory cell MC is raised.

In the sequence of the soft programmings, first, the soft programming verification is performed (Step S7).

In the soft program verification, the word line WL connected to the gate of the memory transistor MT of memory cell MC which is the target of the soft programming verification is selected by the X decoder 11. Specifically, the potential of the word line WL connected to the gate of the memory cell transistor MT of the memory cell MC which is the target of the soft programming verification is set H level and the potential of the word lines WL except such word line WL are set L level. The source line SL of the memory cell transistor MT of the memory cell MC which is the target of the soft programming verification is grounded (0 V) by the source decoder 12a. The local bit line LBL connected to the drain of the memory cell transistor MT of the memory cell MC which is the target of the soft programming verification is selected by the sector selector 13c and the Y decoder 20. Specifically, one of the plural transistors 16a-16d provided in the sector selector 13c is set ON state to thereby connect the selected local bit lines LBL. One of the plural transistor (not illustrated) provided in the Y decoder 20 is set ON state to thereby connect the selected local bit lines LBL to the signal line BL. Thus, the drain of the memory cell transistor MT of the memory cell MC which is the target of the soft programming verification is connected to the input terminal 50a of the sense amplifier 47 via the selected local bit line LBL, the selected global bit line GBL and the signal line BL. In the soft programming verification, the word line REF_WL_S connected to the gate of the memory cell transistor MT' of the reference cell RC(S) for the soft programming verification is selected by the X decoder 42. Specifically, the word line REF_WL_S connected to the gate of the memory cell transistor MT' of the reference cell RC(S) for the soft programming verification is set H level, and the word lines REF_WL_P, REF_WL_E except said word line are set L level. The source line SL' connected to the source of the memory cell transistor MT' of the reference cell RC(S) for the soft programming verification is grounded (0 V) by the source decoder 44. The reference bit line REF_BL_S connected to the drain of the memory cell transistor MT' of the reference cell RC(S) of the soft programming verification is selected by the Y decoder 45. Specifically, the transistor 46c is set ON state, and the transistors 46a, 46b are set OFF state to thereby select the reference bit line REF_BL_S is selected. Thus, the drain of the memory cell transistor MT' of the reference cell RC(S) for the soft programming verification is connected to the input terminal 50b of the sense amplifier 47 via the reference bit line REF_BL_S and the signal line REF_BL. In the soft programming verification, the transistors 48a, 48b are set OFF state, and the dummy bit lines DUM_BL0, DUM_BL1 are not connected to the signal line REF_BL.

The soft programming verification fails when the threshold voltage of the memory cell transistor MT of a memory cell MC which is the target of the soft programming verification is lower than the threshold voltage SPGMV of the memory cell transistor MT' of the reference cell RC(S) for the soft programming verification. On the other hand, when the threshold voltage of the memory cell transistor MT of the memory cell MC which is the target of the soft programming verification is higher than the threshold voltage SPGMV of the memory cell transistor MT' of the reference cell RC(S) for the soft programming verification, the soft programming verification passes. The pass and failure of the soft programming verification is performed by comparing currents or voltages between the input terminal 50a of the sense amplifier 47 connected to the memory cell MC and the input terminal 50b of the sense amplifier 47 connected to the reference cell RC(S). For example, when the current flowing in the input terminal 50a of the sense amplifier 47 connected to the memory cell MC which is the target of the soft programming verification is smaller than the current flowing in the input terminal 50b connected to the reference cell RC(S) for the soft programming verification, the soft programming verification passes. On the other hand, when the current flowing in the input terminal 50a of the sense amplifier 47 connected to the memory cell MC which is the target of the soft programming verification is larger than the current flowing in the input terminal 50b connected to the reference cell RC(S) for the soft programming verification, the soft programming verification fails. In a case that the result of the soft programming verification is failure, the sense amplifier 47 outputs a signal indicating the failure to the state machine 52.

In the case that the result of the soft programming verification is failure, the soft programming is performed for the memory cell MC (Step S8).

Then, for the memory cell MC, for which the soft programming has been performed, the soft programming verification is performed again (Step S7).

When the result of the soft programming verification is pass, it is judged whether or not the address of the memory cell MC is the last address (Step S9). When the address of the memory cell MC is not the last address (False), 1 is added to the address (address+1) (Step S10), and the soft programming verification is performed for the memory cell MC of the next address (Step S7).

As illustrated in FIG. 10, in the step where the first erasure has been performed, the threshold voltages of the memory cells MC, DC present in the sector 2 are distributed in, e.g., Distribution 101. When the threshold voltage of the memory cells MC, DC present in the sector 2 are all higher than the threshold voltage SPGMV of the reference cell RC(S) for the soft programming as in the Distribution 101 of FIG. 10, the soft programming verification passes for all.

When the soft programming verification for the memory cell MC of the last address has been completed (Truth), the erasure verification is again performed (Step S5).

In the step where the first erasure has been performed, as described above, the threshold voltages of the memory cells MD, DC present in the sector 2 are distributed in, e.g., Distribution 101 of FIG. 10. When the threshold voltages of the memory cells MC, DC present in the sector 2 are all higher than the threshold voltage ERSV of the reference cell RC(E) for the erasure verification as in Distribution 101 of FIG. 10, the erasure verification fails for all.

When the erasure verification fails, the erasure is performed again (Step S6). As described above, the erasure is performed collectively for all the memory cells MC in the sector 2.

Then, the sequence (Steps S7-S10) of the soft programmings described above is suitably performed.

In the step where the second erasure has been performed, the threshold voltages of the memory cells MC, DC present in the sector 2 are distributed in, e.g., Distribution 102 of FIG. 10. When the threshold voltages of the memory cells MC, DE present in the sector 2 are all higher than the threshold voltage SPGMV of the reference cell RC(S) for the soft verification, the soft programming verification passes for all.

After the sequence of the soft programmings, the erasure verification is performed again (Step S5).

When the erasure verification has passed for a selected memory cell MC, it is judged whether or not the address of said memory cell MC is the last address (Step S11). When the address of said memory cell MC is not the last address, 1 is added to said address (address+1) (Step S12), and the erasure verification is performed for a memory cell MC of the next address (Step S5).

In the step where the second erasure has been performed, the threshold voltages of the memory cells MC, DC present in the sector 2 are distributed in, e.g., Distribution 102 of FIG. 10. For the memory cells MC, DC whose threshold voltages are lower than the threshold voltage ERSV of the reference cell RC(E) for the erasure verification, the erasure verification passes. On the other hand, for the memory cells MC, DC whose threshold voltages are higher than the threshold voltage ERSV of the reference cell RC(E) for the erasure verification, the erasure verification fails.

When the erasure verification fails, the erasure is performed again (Step S6). The erasure is performed collectively for all the memory cells MC in the sector 2, as described above.

Then, the sequence of the soft programmings (Steps S7-S10) described above is suitably performed. For example, in the step where the third erasure has been performed, often appears memory cells MC, DC whose threshold voltages are lower than the threshold voltage SPGMV of the reference cell RC(S) for the soft verification.

When the soft programming is performed after the third erasure, the threshold voltages of the memory cells MC, DC present in the sector 2 are distributed in, e.g., distribution 103 of FIG. 10.

After the sequence of the soft programmings has been performed, the erasure verification is performed again (Step S5).

When the erasure verification for the memory cell MC of the last address is completed, the sequence of the erasures for the sector 2 is completed.

Thus, the information written in the memory cells MC present in the sector 2 is erased.

After the erasure of the information written in the memory cells MC present in the sector 2 has been completed, the erasure of the information written in the memory cells MC present in, e.g., the sector 3 is performed.

The erasure of the information written in the memory cells MC present in the sector 3 is performed as follows. As described above, the erasure is performed collectively by one sector.

Before the erasure of the information written in the memory cells MC in the sector 3 which is to be erased, the sequence of preprogrammings is performed.

In the sequence of preprogrammings, the programming verification is performed for all the memory cells MC in the sector 3 (Step S1).

When the result of the programming verification fails, the programming is made for said memory cell MC (Step S2).

Then, the programming verification is made again for the memory cell MC the programming has been made (Step S1).

When the result of the programming verification passes, it is judged whether or not the address of said memory cell MC is the last address (Step S3). When the address of said memory cell MC is not the last address, 1 is added to said address (Step S4), and then the programming verification is made for the memory cell MC of the next address (Step S1).

When the programming verification for the memory cell MC of the last address has been completed, the sequence of the preprogrammings is completed. When the sequence of the preprogrammings has been completed, the sequence of erasures follows.

In the sequence of erasures, first, the erasure verification is made as follows (Step S5).

In the erasure verification, the word line WL connected to the gate of the memory cell transistor MT of a memory cell MC which is the target of the erasure verification is selected by the X decoder 11. Specifically, the word line WL connected to the gate of the memory cell transistor MT of the memory cell MC which is the target of the erasure verification is set H level, and the word lines WL except said word line WL are set L level. The source line SL of the memory cell transistor MT of the memory cell MC which is the target of the erasure verification is grounded (0 V) by the source decoder 12b. The local bit line LBL connected to the drain of the memory cell transistor MT of the memory cell MC which is the target of the erasure verification is selected by the sector selector 13d and the Y decoder 20. Specifically, one of the plural transistors 17a-17d provided in the sector selector 13d is set ON state, whereby the local bit line LBL is selected. One of the plural transistors (not illustrated) provided in the Y decoder 20 is set ON state, whereby the selected bit line LBL is connected to the signal line BL. Thus, the drain of the memory cell transistor MT of the memory cell MC which is the target of the erasure verification is connected to said one input terminal 50a of the sense amplifier 47 via the selected local bit line LBL and the selected global bit line GBL and the signal line BL.

In the erasure verification, the word line REF_WL_E connected to the gate of the memory cell transistor MT' of the reference cell RC(E) for the erasure verification is selected by the X decoder 42. Specifically, the word line REF_WL_E connected to the gate of the memory cell transistor MT' of the reference cell RC(E) for the erasure verification is set H level, and the word lines REF_WL_P, REF_WL_S except said word line are set L level. The source line SL' connected to the source of the memory cell transistor MT' of the reference cell RC(E) for the erasure verification is grounded (0 V) by the source decoder 44. The reference bit line REF_BL_E connected to the drain of the memory cell transistor MT' of the reference cell RC(E) for the erasure verification is selected by the Y decoder 45. Specifically, the transistor 46b is set ON state, the transistors 46a, 46c are set OFF state, whereby the reference bit line REF_BL_E is selected. Thus, the drain of the memory cell transistor MT' of the reference cell RC(E) for the erasure verification is connected to said the other input terminal 50b of the sense amplifier 47 via the reference bit line REF_BL_E and the signal line REF_BL.

In the erasure verification for the memory cells MC in the sector 3, the transistor 48a becomes ON state, whereby the dummy bit line DUM_BL0 is connected to the signal line REF_BL. Accordingly, the plural dummy cells DC provided in the sector 2 are connected to the signal line REF_BL via the dummy local bit line DLBL and the dummy bit line DUM_BL0. The dummy cells DC in the sector 2 have been set erased in advance. The potentials of the word lines WL connected to the gates of the memory cell transistors DT of the dummy cells DC in the sector 2 (DCT2) are all set L level (0 V). Accordingly, to the signal line REF_BL electrically connected to the plural dummy cells DC provided in the sector 2, column leak currents flow. The transistor 48b is OFF state, and the dummy bit line DUM_BL1 is not connected to the signal line REF_BL. Thus, in the erasure verification, not only the reference cell EC(E) for the erasure verification but also the dummy cells DC in the sector 2 different from the sector 3 which is the object of the erasure are electrically connected to the input terminal 50b of the sense amplifier 47.

As described above, the erasure verification fails when the threshold voltage of the memory cell transistor MT of a memory cell MC which is the target of the erasure verification is higher than the threshold voltage of the memory cell transistor MT' of the reference cell RC(E) for the erasure verification. On the other hand, as described above, the erasure verification passes when the threshold voltage of the memory cell transistor MT of a memory cell MC which is the target of the erasure verification is lower than the threshold voltage of the memory cell transistor MT' of the reference cell RC(E) for the erasure verification. The pass and failure of the erasure verification is judged by comparing the currents or the voltages between the input terminal 50a of the sense amplifier 47 connected to the memory cell MC and the input terminal 50b of the sense amplifier 47 connected to the reference cell RC(E). For example, when the current flowing in the input terminal 50a of the sense amplifier 47 connected to the memory cell MC which is the target of the erasure verification is larger than the current flowing in the input terminal 50b of the sense amplifier 47 connected to the reference cell RC(E) for the erasure verification, the erasure verification passes. On the other hand, when the current flowing in the input terminal 50a of the sense amplifier 47 connected to the memory cell MC which is the target of the erasure verification is smaller than the current flowing in the input terminal 50b of the sense amplifier 47 connected to the reference cell RC(E) for the erasure verification, the erasure verification fails. When the result of the erasure verification is failure, the sense amplifier 47 outputs a signal indicates failure to the state machine 52.

When the result of the erasure verification failure, the information written in the memory cell MC is erased (Step S6). The erasure of the information written in the memory cell MC is performed collectively by the unit of one sector, as described above. The erasure is performed at once for all the memory cells MC in the sector 3 here. The erasure of the information written in all the memory cells MC in the sector 3 is performed by setting all the word lines WL in the sector 3 at a negative potential and setting the well (not illustrated) of the sector 3 at a positive potential.

After the erasure, the soft programming verification is performed (Step S7).

When the result of the soft programming verification is failure, the soft programming is performed for said memory cell MC (Step S8).

Then, for the memory cell MC for which the soft programming has been performed, the soft programming verification is performed again (Step S7).

When the result of the soft programming verification is pass, it is judged whether or not the address of said memory cell MC is the last address (Step S9). When the address of the said memory cell MC is not the last address, 1 is added to said address (Step S10), and the soft programming verification is performed for the memory cell MC of the next address (Step S7).

When the soft programming verification for the memory cell MC of the last address has been completed, the erasure verification is performed again (Step S5).

When the erasure verification fails, Steps S6-S10 described above are suitably performed, and the erasure verification is performed again (Step S5).

On the other hand, when the erasure verification passes, it is judged whether or not the address of said memory cell MC is the last address (Step S11). When the address of said memory cell MC is not the last address (False), 1 is added to said address (address+1) (Step S12), and erasure verification is performed for the memory cell MC of the next address (Step S5).

When the erasure verification for the memory cell MC of the last address is completed (Truth), the operation of erasure for said sector 3 is completed.

Thus, the information written in the memory cells MC present in the sector 3 is erased.

Thus, the erasure of the information written in the memory cells of the semiconductor memory device according to the present embodiment is performed.

As described above, according to the present embodiment, in the erasure verification, a selected memory cell MC which is the target of the erasure verification is electrically connected to the input terminal 50a of the sense amplifier 47 via the bit lines LBL, GBL, BL, etc. On the other hand, the reference cell RC(E) is electrically connected to the input terminal 50b of the sense amplifier 47. Furthermore, according to the present embodiment, plural non-selected dummy cells DC in a sector different from the sector containing the memory cell MC which is the target of the erasure verification are connected to the input terminal 50b of the sense amplifier 47 via the dummy bit lines DLBL, etc. Thus, according to the present embodiment, the column leak currents of the plural non-selected memory cells MC commonly connected by the bit lines LBL can be compensated by the column leak currents of the plural non-selected dummy cells DC commonly connected by the dummy bit lines DLBL. Thus, according to the present embodiment, the erroneous judgment of the erasure verification can be prevented without failure, and consequently, the semiconductor memory device can be highly reliable.

Modified Embodiments

The present invention is not limited to the above-described embodiment and can cover other various modifications.

For example, in the above-described embodiment, the memory cell array 10 is divided in four sectors, but the number of the sectors is not limited to four.

In the above-described embodiment, the application times of the erasure pulses to be applied until the erasure for all the memory cells in one sector is completed is three times but is not limited to three times. The voltage of the erasure pulse and the application period of time of the erasure pulse are suitably set to thereby suitably set the application times of the erasure pulse.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
a plurality of memory blocks each including a bit line to which a plurality of memory cells are connected, and a dummy bit line to which a plurality of dummy cells are connected, the bit line and the dummy bit line included in each one of the plurality of memory blocks being different from the bit line and the dummy bit line included in another of the plurality of memory blocks;
a reference cell provided separate from the plurality of memory blocks; and
a sense amplifier provided with the plurality of memory blocks, the sense amplifier including a first input terminal to which a selected memory cell of the plurality of memory cells is to be electrically connected via the bit line, and a second input terminal to which the reference cell is to be electrically connected,
the dummy bit line of a first memory block of the plurality of memory blocks being to be electrically connected to the second input terminal of the sense amplifier, the first memory block being different from a second memory block of the plurality of memory blocks including the selected memory cell,
the sense amplifier comparing voltages or currents of the first input terminal connected to the selected memory cell of the second memory block and the second input terminal connected to the reference cell and the dummy bit line of the first memory block.

2. The semiconductor memory device according to claim 1, wherein
the semiconductor memory device is an electrically erasable nonvolatile semiconductor memory device, and
the dummy bit line of the first memory block is electrically connected to the second input terminal of the sense amplifier when an erasure verification of the selected memory cell is performed.

3. The semiconductor memory device according to claim 2, wherein when the erasure verification is performed, the plurality of dummy cells are set to erase state in advance.

4. The semiconductor memory device according to claim 1, wherein a number of the memory cells connected to the bit line is equal to a number of the dummy cells connected to the dummy bit line.

5. The semiconductor memory device according to claim 1, wherein a size of the memory cell is equal to a size of the dummy cell.

6. An erasure verification method for a semiconductor memory device, the method comprising:
connecting electrically a selected memory cell provided in a first memory block of a plurality of memory blocks with a first input terminal of a sense amplifier by a bit line, the sense amplifier being provided with the plurality of memory blocks, the plurality of memory blocks each including the bit line to which a plurality of memory cells are connected, and a dummy bit line to which a plurality of dummy cells are connected, the bit line and the dummy bit line included in each one of the plurality of memory blocks being different from the bit line and the dummy bit line included in another of the plurality of memory blocks;
connecting electrically a reference cell with a second input terminal of the sense amplifier;
connecting electrically the dummy bit line provided in a second memory block different from the first memory block with the second input terminal of the sense amplifier; and
performing an erasure verification by comparing voltages or currents of the first input terminal connected to the selected memory cell of the second memory block and the second input terminal connected to the reference cell and the dummy bit line of the first memory block by the sense amplifier.

7. The erasure verification method for the semiconductor memory device according to claim 6, wherein before the performing the erasure verification, the plurality of dummy cells are set to erase state.

8. The erasure verification method for the semiconductor memory device according to claim 6, wherein a number of the memory cells connected to the bit line is equal to a number of the dummy cells connected to the dummy bit line.

9. The erasure verification method for the semiconductor memory device according to claim 6, wherein a size of the memory cell is equal to a size of the dummy cell.

* * * * *